United States Patent
Sizikov et al.

(10) Patent No.: US 11,249,033 B2
(45) Date of Patent: Feb. 15, 2022

(54) METHOD AND DEVICE FOR MEASURING THE PHYSICAL PARAMETERS OF A MATERIAL

(71) Applicants: Oleg Kreonidovich Sizikov, Samara (RU); Vladimir Valerievich Konnov, Samara (RU)

(72) Inventors: Oleg Kreonidovich Sizikov, Samara (RU); Vladimir Valerievich Konnov, Samara (RU)

(*) Notice: Subject to any disclaimer, the term of this patent is extended or adjusted under 35 U.S.C. 154(b) by 57 days.

(21) Appl. No.: 16/760,617

(22) PCT Filed: Nov. 16, 2018

(86) PCT No.: PCT/RU2018/000755
§ 371 (c)(1),
(2) Date: Apr. 30, 2020

(87) PCT Pub. No.: WO2019/103655
PCT Pub. Date: May 31, 2019

(65) Prior Publication Data
US 2020/0348246 A1    Nov. 5, 2020

Related U.S. Application Data

(63) Continuation of application No. PCT/RU2018/000755, filed on Nov. 16, 2018.

(30) Foreign Application Priority Data

Nov. 21, 2017   (RU) ................................ 2017140593

(51) Int. Cl.
*G01N 22/04*     (2006.01)
*G01K 7/02*      (2021.01)
*G01N 27/22*     (2006.01)

(52) U.S. Cl.
CPC ............... *G01N 22/04* (2013.01); *G01K 7/02* (2013.01); *G01N 27/221* (2013.01)

(58) Field of Classification Search
CPC ...... G01N 22/04; G01N 27/221; G01N 22/00; G01K 7/02; G01F 23/28; G01R 27/26
See application file for complete search history.

(56) References Cited

U.S. PATENT DOCUMENTS

2006/0279275 A1* 12/2006 Simpson ................. G01R 27/04
                                                     324/750.16
2016/0108729 A1*  4/2016 Li ........................... E21B 49/08
                                                     702/12

FOREIGN PATENT DOCUMENTS

CN    103091340 A     5/2013
EP     2160468 A1    11/2001
(Continued)

*Primary Examiner* — Alvaro E Fortich
*Assistant Examiner* — Zannatul Ferdous
(74) *Attorney, Agent, or Firm* — Nadya Reingand; Yan Hankin

(57) ABSTRACT

The technical solution relates to measurement technology and is intended for measuring the dielectric permittivity and moisture of highly conductive loose, paste-like and fluid materials such as saline slurry, anthracite, ore, crude oil and oil sludge. The present method is based on using a sensor configured as a segment of a long transmission line, and involves feeding a high-frequency probing signal from a generator that is swept through a range of frequencies to an input of the sensor, and measuring harmonic frequencies at which a length of a signal conductor of the sensor is equal to or a multiple of a half-wavelength of the probing signal in the material filling the sensor. The harmonic frequencies are determined based on a voltage minimum at an output of a detector configured as a phase discriminator, the output voltage of which attains a minimum when input signals of the detector are either in-phase or antiphase. Inputs of the (Continued)

detector are coupled to an input and output of the sensor via segments of a coaxial cable which have the same electrical length, said segments being matched at the outputs. Designs for a moisture meter for carrying out the above method are proposed. For the purpose of carrying out measurements in pipelines, the sensor is configured as a conduit having the signal conductor arranged therein. For loose materials in hoppers and on conveyor belts, the sensor is configured as a shield which a U-shaped rod is secured to. The technical result is an increase of measurement accuracy.

20 Claims, 11 Drawing Sheets

(56) References Cited

FOREIGN PATENT DOCUMENTS

| | | | | |
|---|---|---|---|---|
| EP | 2345890 | A2 | 7/2011 | |
| RU | 2571301 | C2 | 12/2015 | |
| RU | 2576552 | C1 | 3/2016 | |
| WO | WO-2016043629 | A1 * | 3/2016 | ............. G01F 23/28 |

* cited by examiner

METHOD AND DEVICE FOR MEASURING THE PHYSICAL PARAMETERS OF A MATERIAL

CROSS-REFERENCE TO RELATED APPLICATIONS

The present application is a national stage application from PCT application PCT/RU2018/000755 filed Nov. 16, 2018 which claims priority to Russian patent application RU2017140593 filed Nov. 21, 2017, all of which are incorporated herein in their entirety.

FIELD OF THE INVENTION

The present application is a national stage application from PCT application PCT/RU2018/000755 filed Nov. 16, 2018 which claims priority to Russian patent application RU2017140593 filed Nov. 21, 2017, all of which are incorporated herein in their entirety.

BACKGROUND OF THE INVENTION

WO 2015041568 A1 discloses a method for measuring the physical parameters of a material by using a sensor configured as a segment of a long transmission line having a signal conductor and one or more shielding conductors. The sensor is filled with a controlled material, and a harmonic probing signal generated by a generator is fed to an input of the sensor. The generator is swept through a range of frequencies, and a voltage at an output of a detector configured to convert the harmonic probing signal to a low-frequency voltage is measured during said sweeping. Harmonic frequencies are determined based on minimum values of said voltage, with the harmonic frequencies being frequencies at which a length of the signal conductor of the sensor is equal to or a multiple of a half-wavelength (i.e. is equal to the half-wavelength or equal to a wavelength, or equal to several half-wavelengths) of the probing signal in the material filling the sensor at these frequencies. The harmonic frequency measured when filling the sensor with the controlled material is compared to the harmonic frequency measured when filling the sensor with air, and the physical parameters of the material are determined based on these harmonic frequencies or the ratio thereof. The signal conductor of the sensor is connected to the shielding conductor at its end, and the detector is coupled directly to the input of the sensor.

An apparatus (moisture meter) for performing the above-mentioned method is described in RU 128333 U1, RU 2572087 C2, RU 2572819 C2, RU 2585255 C2, EP 2921848 A1. A detailed description of the prior art apparatus is also given at the following websites: http://fizepr.ru/, http://fizepr.com/.

The prior art moisture meter comprises: a sensor configured as a segment of a long transmission line having a signal conductor and one or more shielding conductors, between which a space is to be filled with a controlled material; a generator coupled to an input of the sensor and configured to generate a high-frequency harmonic probing signal, the generator being configured to be swept through a range of frequencies and having a control input for frequency adjustment; a detector configured to convert the high-frequency probing signal to a low-frequency voltage, the detector being coupled between an output of the generator and the input of the sensor and being provided directly at the input of the sensor; a measurement and control device which the control input of the generator and the output of the detector are coupled to.

The above-mentioned method and apparatus for its performance are characterized by using a direct and absolute technique for dielectric permittivity measurement which relies on measuring the harmonic frequencies of the probing signal and converting a resulting dielectric permittivity value to a moisture value of the controlled material. Said harmonics are resonant frequencies of the segment of the long transmission line of the sensor and are characterized in that the length of the signal conductor of the sensor is equal to or a multiple of the half-wavelength of the electromagnetic probing signal in the material filling the sensor at these frequencies. A criterion for achieving the harmonic frequency (resonant frequency) is a minimum voltage at the output of the detector. The probing signal is highly attenuated, a resonance Q-factor deteriorates, a resonance bandwidth expands and, consequently, a measurement accuracy of moisture reduces in case of conductive materials. A resonance may be absent at all in highly conductive materials. To enable measurements of such materials, for example, measurements of crude oil, the following solution is applied in the prior art moisture meters: the signal conductor (probe) of the sensor is placed inside a dielectric shell—a tube. However, the application of the dielectric shell no longer solves the above-mentioned problem at a high electrical conductivity of the material, for example, as with a saturated salt solution. Furthermore, the dielectric tube cannot be used for some applications of the moisture meter—for example, the dielectric shell is collapsed when arranging such a moisture meter in a lump material flow on a conveyor belt. Using the dielectric shell of the probe reduces the sensitivity and measurement accuracy of the moisture meter. A calibration curve for such a moisture meter is determined by not only the parameters of the controlled material but also parameters of the dielectric tube: its diameter, wall width, and a dielectric permittivity of its component material.

One more drawback of the prior art apparatus selected as a first analogue is a limited range of operating temperatures. In the prior art apparatus, semiconductor diodes included in the detector are coupled directly to the input of the sensor and have substantially the same temperature as the controlled material. Therefore, a range of temperatures for the controlled material in the prior art apparatus is limited to the allowable temperatures of the semiconductor diodes.

RU 2154816 C2 and EP 0829007 B1 disclose a method and apparatus for measuring the physical parameters of a material, in which a sensor configured as a segment of a long transmission line having a signal conductor and two shielding conductors is used. The sensor is filled with a controlled material and a harmonic probing signal generated by a generator is fed to an input of the sensor. A phase difference between the phase of the probing signal having passed through the sensor and segments of a coaxial transmission line, which are coupled to the sensor, and the phase of the signal having passed through the segment of a reference transmission line, which is coupled in parallel to the sensor, is measured and used to determine the moisture of the material.

A moisture meter performing the above-described method comprises: a sensor configured as a segment of a long transmission line having a signal conductor and two shielding conductors, between which a space is to be filled with a controlled material, the shielding conductors being constituted by walls of a metal hopper and the signal conductor being made as a metal rod installed between and parallel to the walls of the hopper; first and second segments of a coaxial transmission line which are coupled to an input and output of the sensor, respectively; a high-frequency harmonic probing signal generator coupled to the input of the sensor through the first segment of the coaxial transmission line; a segment of a reference transmission line having an input coupled to an output of the generator; a phase detector having a first input and a second input, the segment of the reference transmission line having an output coupled through a mixer to the first input of the phase detector, and the second segment of the coaxial transmission line having an output coupled through a second mixer to the second input of the phase detector; a measurement and control device which an output of the detector is coupled to. Intermediate horns configured to provide the reflection-less matching of a wave impedance of the first and second segments of the coaxial transmission line and a wave impedance of the transmission line of the sensor are arranged at the input and output of the sensor. The intermediate horns are coated, at the transition to the sensor, with a layer transparent to the electromagnetic probing signal.

The above-described technical solution is based on dielectric permittivity measurement, but the method used for dielectric permittivity measurement is indirect in the sense that the measurement result depends on the parameters of the segment of the reference transmission line. Correspondingly, this method does not allow achieving a maximum measurement accuracy.

The method for moisture measurement, which is based on measuring the phase difference between the phase of the probing signal having passed through the controlled material and the phase of the signal having passed through the segment of the reference transmission line, is applied in a variety of moisture meters described, for example, in the following monography: Benzar V. K., Tehnika SVCh-vlagometrii.—Minsk: Vysshaya shkola, 1974, 352 pp. Similar to the technical solutions disclosed in this monography, the second analogue has the following drawback: the total phase shift of the signal in the sensor and the segments of the transmission lines which are coupled to the sensor depends on not only the dielectric permittivity of the material filling the sensor but also the matching between the wave impedance of the transmission line of the sensor and the wave impedances of the segments of the transmission line which are coupled to the sensor. The wave impedance of the transmission line of the sensor is different for various controlled materials, and changes as the moisture of the controlled material changes. To reduce the impact of the wave impedance of the sensor on the measured phase difference, it is proposed in the second analogue to arrange the matching horns coated with the layer transparent to the electromagnetic probing signal at the input and output of the sensor. However, the horns provide the matching within a relatively narrow range of wave impedance values, and it is furthermore possible to use the horns only for a narrow range of tasks.

According to the above-described moisture meters, the moisture is calculated based on a measured phase value, for which reason the phase detector should have a stable and linear phase-to-voltage conversion characteristic within the whole range of phase values from 0 to 360°. The conversion linearity of the detector depends on an amplitude of its input signals. In the conductive materials, the probing signal is highly attenuated, which impacts on the linearity of the characteristics of the phase detector. The phase shift of the signal in such materials may exceed manifold 360°. These factors have resulted in a situation where the prior art technical solution has only a restricted application and is not used for controlling the highly conductive materials.

RU 2576552 C1, DE 212015000221 U1 and WO 2016043629 A1 disclose a method and apparatus for measuring the physical parameters of a material, which are closest to the present technical solution.

In this prior art method selected as a prototype, a sensor configured as a segment of a long transmission line having a signal conductor and one or more shielding conductors is used, the sensor being filled with a controlled material. A high-frequency harmonic probing signal generated by a generator is fed to an input of the sensor. The generator is swept through a range of frequencies and a voltage at an output of a detector configured to convert the high-frequency probing signal to a low-frequency voltage is measured during said sweeping. Minimum values of said voltage are used to determine harmonic frequencies at which a length of the signal conductor of the sensor is equal to or a multiple of a half-wavelength of the probing signal in the material filling the sensor at these frequencies. The probing signal is fed from the input of the sensor to an input of the detector through a first additional segment of the transmission line where a traveling-wave mode is provided. The harmonic frequency measured when filling the sensor with the controlled material is compared to the harmonic frequency measured when filling the sensor with air, and the physical parameters of the material are determined based on these frequencies or the ratio thereof.

The apparatus known from RU 2576552 C1, DE 212015000221 U1 and WO 2016043629 A1 comprises: a sensor configured as a segment of a long transmission line having a signal conductor and one or more shielding conductors, between which a space is to be filled with a controlled material; a generator coupled to an input of the sensor and configured to generate a high-frequency harmonic probing signal, the generator being configured to be swept through a range of frequencies and having a control input for frequency adjustment; a detector configured to convert the high-frequency probing signal to a low-frequency voltage; a measurement and control device which the control input of the generator and an output of the detector are coupled to; a first additional segment of a two-conductor transmission line, the first additional segment having an input coupled to the input of the sensor and an output coupled to a first input of the detector. The first additional segment of the transmission line is matched at the output coupled to the detector, which is provided, for example, by coupling a matching resistor in parallel to the output of said segment. The generator has an output coupled to the input of the sensor through an input segment of the transmission line.

Similar to the first analogue, the above-described method and apparatus for its performance are characterized by using a direct and absolute technique for dielectric permittivity measurement, which relies on measuring the harmonic frequencies of the probing signal and converting the resulting dielectric permittivity value to the moisture value of the controlled material. However, this technical solution does not allow obtaining a high measurement accuracy for conductive materials. The reasons for this drawback are the same as for the technical solution selected as the first analogue. These reasons are described in detail above in the paragraphs relating to the first analogue.

SUMMARY OF THE INVENTION

It is an objective of the present technical solution to increase the accuracy of measuring the physical parameters of conductive materials, including materials having abrasive properties and loose coarse-fraction materials.

The objective above is achieved by a method for measuring the physical parameters of a material, in which a sensor configured as a segment of a long transmission line having a signal conductor and one or more shielding conductors is used. The sensor is filled with a controlled material and a high-frequency harmonic probing signal generated by a generator is fed to an input of the sensor. The generator is swept through a range of frequencies and a voltage at an output of a detector configured to convert the high-frequency probing signal to a low-frequency voltage is measured during said sweeping. Minimum values of said voltage are used to determine harmonic frequencies at which a length of the signal conductor of the sensor is equal to or a multiple of a half-wavelength of the probing signal in the material filling the sensor at these frequencies. The probing signal is fed from the input of the sensor to an input of the detector through a first additional segment of the transmission line where a traveling-wave mode is provided. The harmonic frequency measured when filling the sensor with the controlled material is compared to the harmonic frequency measured when filling the sensor with air, and the physical parameters of the material are determined based on these frequencies or the ratio thereof. According to the present technical solution, the harmonic frequencies are determined by comparing a phase of the probing signal at the input of the sensor to the phase of the probing signal at an output of the sensor. Said comparing is performed in the detector configured as a phase discriminator in which an output voltage attains a minimum when input signals of the phase discriminator are either in-phase or antiphase. The probing signal is fed from the output of the sensor to a second input of the detector through a second additional segment of the transmission line, which is included in the moisture meter and which has an electrical length set equal to an electrical length of the first additional segment. The traveling-wave mode is provided in the second additional segment. Said physical parameters of the material comprise a dielectric permittivity, moisture, substance-mixture concentration, density, refraction index of the material.

Similar to the methods in the first analogue and the prototype, the present method provides a direct and absolute technique for dielectric permittivity (refraction index) measurement which relies on measuring the harmonic frequencies of the probing signal and converting the resulting dielectric permittivity value to the moisture (density or concentration) value of the controlled material.

By comparison, the second analogue involves measuring the dielectric permittivity in an indirect manner, and a total moisture measurement error is defined by two factors: a permittivity measurement error and a permittivity-to-moisture conversion error. In the present technical solution, the permittivity measurement error is reduced to a minimum, and the total moisture measurement error is defined by one factor only—the accuracy of converting the measured dielectric permittivity to the moisture value. Thus, the present technical solution is indeed more accurate than the prior art solutions based on measuring the dielectric permittivity in an indirect manner.

The objective above is also achieved by that, in the present method, the generator is swept through the range of frequencies in discrete steps, the voltage at the output of the detector is determined in each step of said sweeping, and the harmonic frequencies are determined based on a frequency dependency of the voltage measured in the whole range of sweep frequencies of the generator.

The objective above is also achieved by that, in the present method, levels (amplitudes) of the probing signal at the input and output of the sensor are compared to each other, and dielectric loss in the controlled material is determined based on the ratio of the levels. The determined dielectric loss is then used to refine the measured physical parameters.

Said method is performed as follows: determining a real component of the refraction index based on the measured ratio of the harmonic frequencies; determining an imaginary component of the refraction index based on the ratio of the levels of the probing signal at the input and output of the sensor; calculating a complex dielectric permittivity based on the two real and imaginary components; and determining the moisture (or other physical parameters) of the material based on the complex dielectric permittivity with high accuracy. The present solution consisting in additionally measuring the amplitudes of the probing signal allows the complex dielectric permittivity to be determined even at a high dielectric loss tangent exceeding one.

Relative to an apparatus for performing the present method, the objective above is achieved by that the apparatus for measuring the physical parameters of a material comprises: a sensor configured as a segment of a long transmission line having a signal conductor and one or more shielding conductors, between which a space is to be filled with a controlled material; a generator coupled to an input of the sensor and configured to generate a high-frequency harmonic probing signal, the generator being configured to be swept through a range of frequencies and having a control input for frequency adjustment; a detector configured to convert the high-frequency probing signal to a low-frequency voltage; a measurement and control device which the control input of the generator and an output of the detector are coupled to; a first additional segment of the two-conductor transmission line, the first additional segment having an input coupled to the input of the sensor and an output coupled to a first input of the detector. The first additional segment of the transmission line is matched at the output coupled to the detector, which is provided, for example, by coupling a matching resistor in parallel to the output of this segment. An output of the generator is coupled to the input of the sensor either directly or through an input segment of the transmission line. According to the present technical solution, the detector is configured as a phase discriminator in which an output voltage attains a minimum when high-frequencies input signals of the phase discriminator are in-phase or antiphase. A second additional segment of the transmission line is provided, the second additional segment having an input coupled to the output of the sensor and an output coupled to a second input of the detector. The second additional segment has an electrical length equal to an electrical length of the first additional segment. The second additional segment of the transmission line is also matched at the output coupled to the detector. A coaxial cable may be used as the two-conductor line for the additional segments and the input segment.

The objective above is also achieved by that the probing signal generator is configured as a synthesizer producing the frequency of the probing signal in accordance with a digital code set by the measurement and control device. The measurement and control device comprises a processor that calculates the physical parameters of the controlled material based on values of the harmonic frequencies of the probing signal. The harmonic frequencies are determined based on the minimum voltage at the output of the detector as follows: collecting the whole spectrum of the output signal of the detector, which represents the frequency dependency of the voltage of the detector in the whole range of sweep frequencies of the generator, finding minima in the spectrum, and determining frequency values at the minima.

The objective above is also achieved by that an amplifier is included in the measurement and control device, the amplifier having a nonlinear gain characteristic and providing the amplification of the output voltage of the detector such that a low-level voltage is amplified, while a high-level voltage is limited. With such conversion of the output signal of the detector, minimum spikes in the spectrum become sharp, thereby allowing one to increase the accuracy of measuring a minimum position on a frequency axis.

The objective above is also achieved by that a device for measuring and calculating the ratio of the levels of the probing signal at the input and output of the sensor is included in the detector. Said device has an output coupled to the measurement and control device. The processor of the measurement and control device calculates the physical parameters of the material based on the values of the harmonic frequencies and the ratio of the levels of the probing signal at the input and output of the sensor.

The objective above is also achieved by that the coupling of the first additional segment of the transmission line to the input of the sensor is performed using a power divider. The power divider is configured, for example, as a resistor coupled between the input of the sensor and the input of the first additional segment of the transmission line. The resistor and an input resistance of the first additional segment constitute a voltage divider. The power divider performs the following two functions:
  decoupling the input circuits of the detector from the first additional segment, thereby removing the impact of this segment on the phase of the probing signal at the output of the sensor;
  reducing the power of the probing signal at the second input of the detector.

The necessity of reducing the power of the probing signal at the second input of the detector is caused by that a generator power has to be highly increased to make measurements on highly conductive materials. By using the power divider, the level of the probing signal at the second input of the detector is limited to an allowable level.

The objective above is also achieved by that the shielding conductor of the sensor is made as a conduit, while the signal conductor of the sensor is made as a metal rod arranged inside the conduit either parallel to a conduit axis or perpendicularly to the conduit axis along a conduit diameter. The signal conductor has ends secured to electrical leads comprising a dielectric insulator. Each electrical lead is arranged either on a side surface of the conduit, or on an end plug of the conduit. Correspondingly, the signal conductor of the sensor is either U-shaped, or L-shaped, or shaped as a linear segment. The input and additional segments of the transmission line are made of a coaxial cable and coupled to the signal conductor of the sensor through the electrical leads.

The objective above is also achieved by that two metal bodies made as cups each having an opening at its bottom are mounted on an external surface of the conduit coaxially relative to the electrical leads. The electrical leads are mounted in the openings. The cups are connected through metal tubes to an additional body having the detector installed therein. The additional segments of the transmission line are arranged in the metal tubes.

The objective above is also achieved by that the shielding conductor of the sensor is made as a shield, while the signal conductor of the sensor is made as a metal rod that is mounted on the shield and is U-shaped. The signal conductor has ends secured to the electrical leads comprising a dielectric insulator. The electrical leads are secured in the shield. The input and additional segments of the transmission line are made of a coaxial cable and coupled to the signal conductor of the sensor through the electrical leads.

The objective above is also achieved by that two metal bodies made as cups each having an opening at its bottom are mounted on an external surface of the shield coaxially relative to the electrical leads. The electrical leads are mounted in the openings. The detector is mounted in the first metal body in which the output of the signal conductor of the sensor is provided. The cups are connected by a metal tube having the first additional segment of the transmission line arranged therein. The second additional segment of the transmission line is arranged in the first metal body.

The objective above is also achieved by that the conductors of the input and additional segments of the transmission line and the conductors of the sensor are made of metal resistant to high-temperature exposure, and the electrical connection of said conductors is made by a high-temperature solder.

The objective above is also achieved by that the signal conductor made as the metal rod has an end opening along a rod axis. A temperature sensor, for example, a thermocouple, is mounted in the end opening. The temperature sensor has wires coupled to the measurement and control device, the wires being wound around a ferrite ring at the exit of the end opening of the rod. The wires of the temperature sensor are made insulated from the signal and shielding conductors. By winding the wires around the ferrite ring, the wires form a choke coil that has a high resistance at the frequencies of the probing signal, thereby removing the impact of the wires of the temperature sensor on the probing signal. By measuring the temperature of the controlled material, it is possible to increase the accuracy of measuring the moisture of the controlled material because the dielectric permittivity depends on not only a water content in the controlled material but also its temperature.

The objective above is also achieved by that the shielding and signal conductors of the sensor are made as parallel rods. The shielding conductor may comprise either one rod or several parallel rods among which one rod has a through hole made along a rod length. Each of the rods has ends secured to first and second metal bases. The rods constituting the shielding conductor are secured to the bases such that they form an electrical contact with the bases. The ends of the signal conductor are secured to the bases by using electrical leads comprising a dielectric insulator. The input and additional segments of the transmission line are made of a coaxial cable and coupled to the signal conductor of the sensor through the electrical leads, the input and the first additional segment of the transmission line being coupled to the input of the sensor on the side of the first base, and the second additional segment of the transmission line being coupled to the output of the sensor on the side of the second metal base and being brought out to the side of the first base via the through hole in the rod.

The objective above is also achieved by that the shielding conductor of the sensor is made as a conduit having slots on conduit walls, while the signal conductor of the sensor is made as a metal tube arranged in the conduit parallel to a conduit axis. The ends of the signal conductors are secured to electrical leads comprising a dielectric insulator. The electrical leads are arranged on end conduit walls. The input and additional segments of the transmission line are coupled to the signal conductor of the sensor through the electrical leads. The input and additional segments of the transmission line are made of a coaxial cable. The second additional segment of the transmission line, which is coupled to the output of the sensor, is arranged in the tube forming the signal conductor. Said segment of the coaxial cable is wound around a ferrite ring at the exit of the tube on the side of the input of the sensor.

The present technical solution is preferably used for measuring the moisture of highly conductive loose, paste-like and fluid materials. In particular, such materials include:
mineral coal, including anthracite;
ore, iron-ore concentrate;
saline slurry (hard sodium salt in its saturated solution);
sewage sludges;
sludges in cement industry;
oil sludge, crude oil;
mineral fertilizers.

BRIEF DESCRIPTION OF FIGURES

The essence of the present technical solution is explained in FIGS. 1-10.

DETAILED DESCRIPTION OF THE INVENTION

Figure 1:
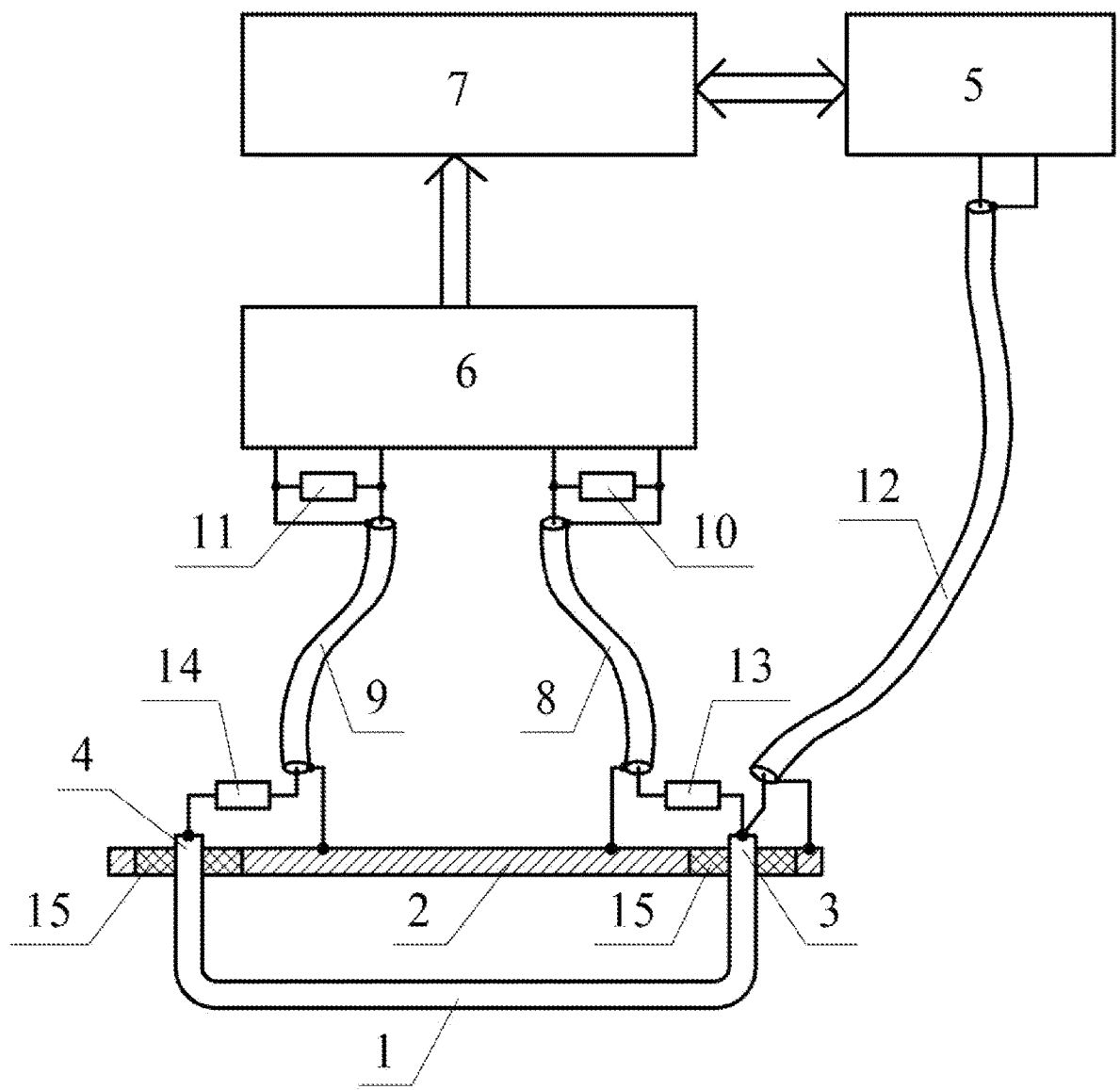
FIGS. 1-8 show a design of an apparatus for measuring the physical parameters of a material in accordance with different embodiments.

The present apparatus for measuring the physical parameters of a material is characterized by the following features. The measuring apparatus (moisture meter) comprises a sensor configured as a segment of a long transmission line constituted by a signal conductor 1 and one or more shielding conductor 2. A space between the conductors 1 and 2 is intended to be filled with a controlled material. The sensor comprises an input 3 and an output 4. The input 3 of the sensor is coupled to an output of a high-frequency harmonic probing signal generator 5, the generator being configured to be swept through a range of frequencies and having a control input for frequency adjustment. The present apparatus also comprises a detector 6 and a measurement and control device 7 which the control input of the generator 5 and an output of the detector 6 are coupled to. The detector 6 is configured as a phase discriminator. The detector 6 converts the high-frequency probing signal picked up at the input 3 and the output 4 of the sensor to a low-frequency output voltage, the output voltage attaining a minimum when input signals of the detector 6 are in-phase or antiphase. The detector 6 is coupled to the sensor by means of two segments 8, 9 of a two-conductor transmission line which is represented by a coaxial cable, as shown in FIGS. 1-10. The detector 6 has a first input connected to the input 3 of the sensor by means of the first segment 8 of the coaxial cable and a second input connected to the output 4 of the sensor by means of the second segment 9. The additional segments 8 and 9 have the same electrical length. The segments 8, 9 at the outputs connected to the inputs of the detector 6 are configured to be matched, for example, by connecting matching resistors 10 and 11 in parallel to the outputs of the segments. The resistors 10, 11 have a resistance selected such that a total resistance of the inputs of the detector 6 and the resistors connected in parallel thereto is equal to a wave impedance of coaxial cables which the segments 8, 9 are made of. Said matching provides a traveling-wave mode for signals transmitted over the additional segments 8, 9. As a result, a ratio of signal levels at the inputs and outputs of the segments 8, 9 remains unchanged, and a phase difference of signals also retains at the same electrical length.

The generator 5 has an output coupled to the input 3 of the sensor either directly or through an input segment 12 of the transmission line which may be represented by a coaxial cable. The coupling of the input segment 12 and the additional segments 8, 9 is performed as follows: signal conductors of the segments 8, 9, 12 are connected to the signal conductor 1 of the sensor, shielding conductors of these segments are connected to the shielding conductor 2 of the sensor. The coupling of the first segment 8 to the input 3 of the sensor may be performed through a resistor 13 serving as a power divider. An output voltage ratio of this divider is defined by:

$$\frac{U_{out}}{U_{in}} = \frac{\rho_{cab}}{R + \rho_{cab}}, \quad (1)$$

where $U_{in}$ is the voltage at the input of the divider, $U_{out}$ is the voltage at the output of the divider, $\rho_{cab}$ is the wave impedance of the segment 8 of the transmission line, R is the resistance of the resistor 13.

To equate the electrical lengths of channels constituted by the first and second additional segments 8, 9, the input of the second additional segment 9 may be connected to the output 4 of the sensor through an additional resistor 14 similar in size to the resistor 13 at the input of the first segment 8, but the resistance of the resistor 14 should be low or equal to zero.

As shown in FIGS. 1-8, the signal conductor 1 is configured as a metal rod that has ends secured to electrical leads 15 comprising a dielectric insulator. The electrical leads 15 are used for sealing the sensor and transmitting the probing signal to the area occupied by the controlled material.

Figure 2:
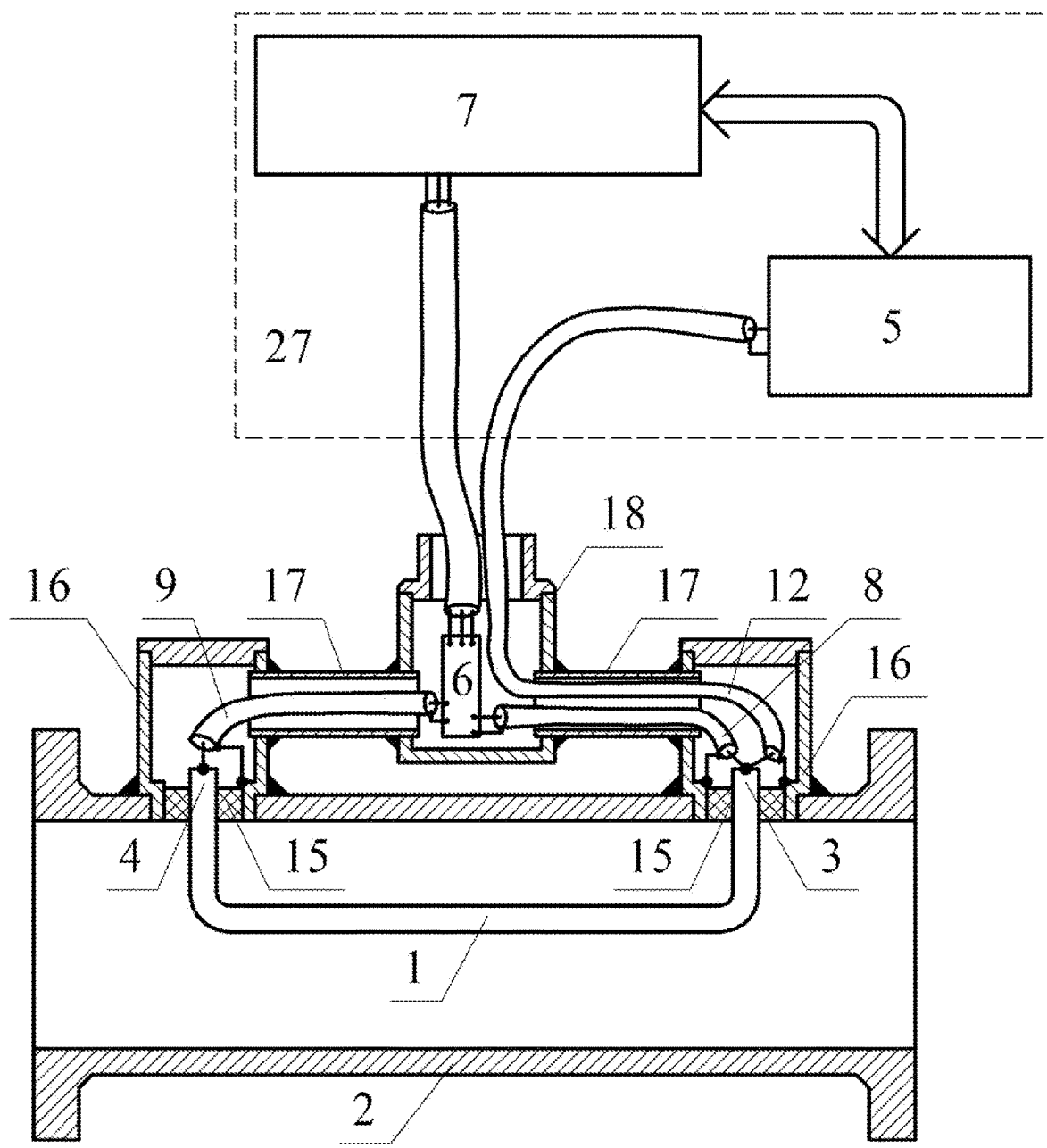
Figure 3:
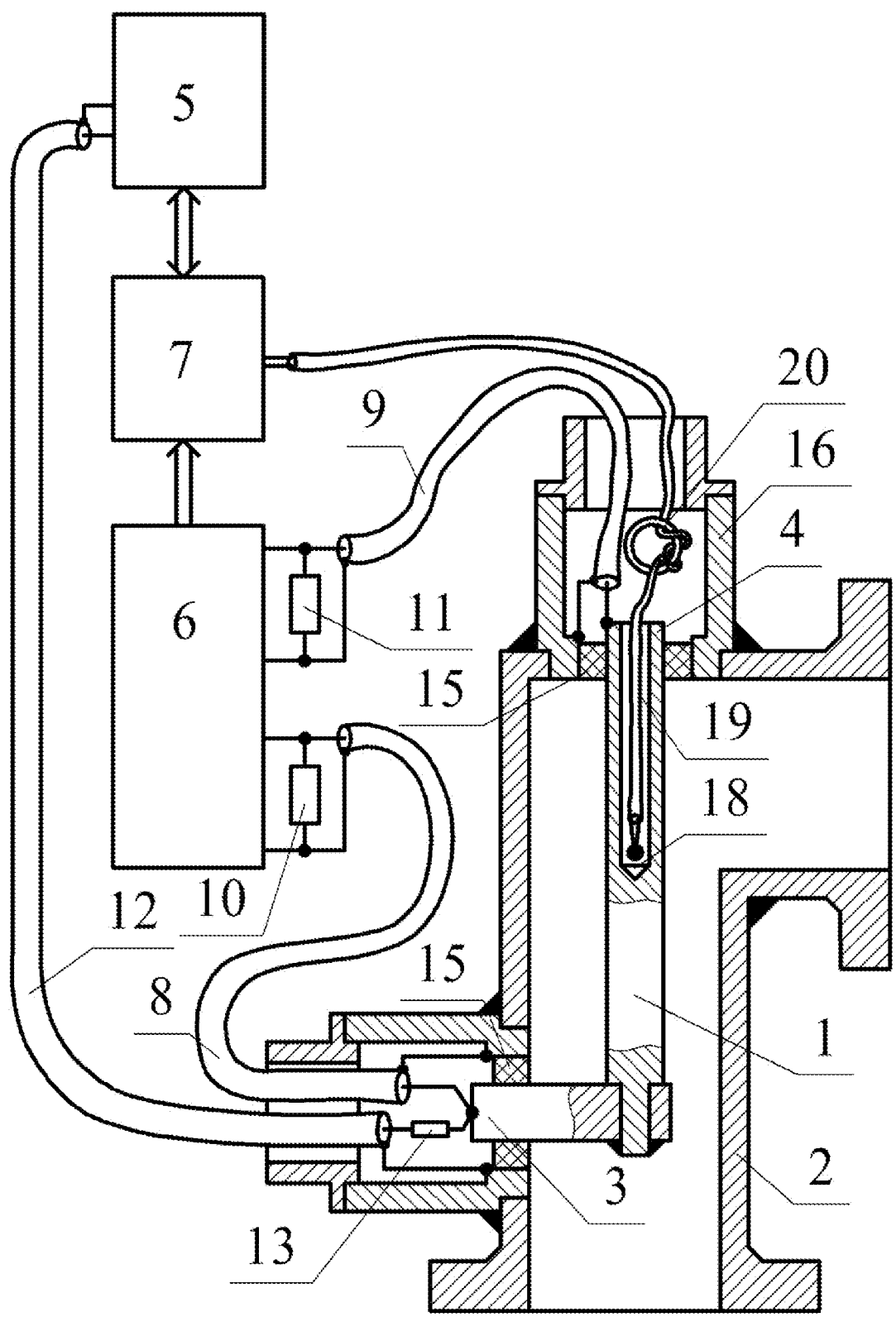
Figure 4:
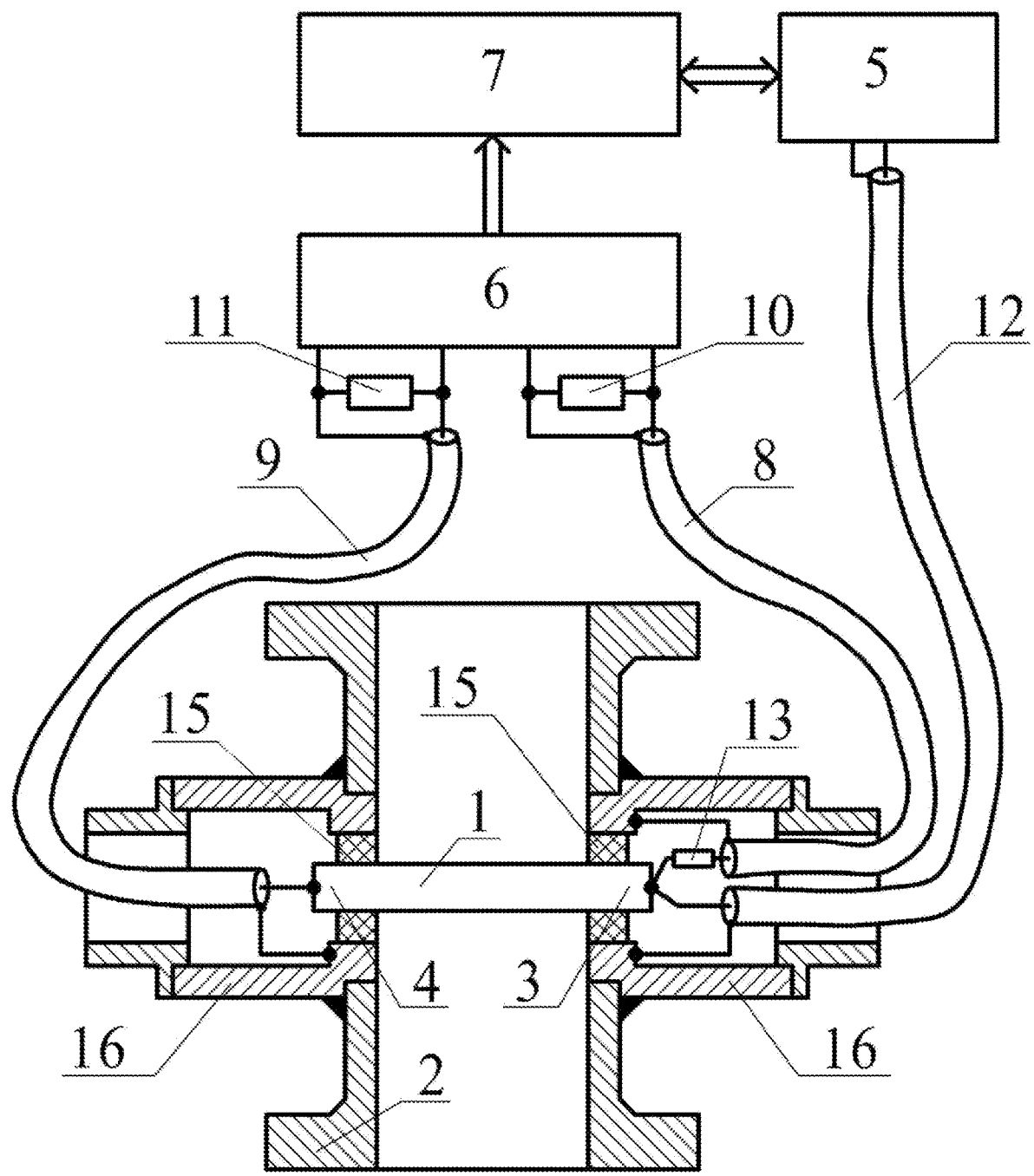

FIGS. 2-4 show a design of a moisture meter (measuring apparatus) for controlling fluid and paste-like materials in a pipeline, i.e. in a pressure-induced flow. In this moisture meter, the shielding conductor 2 is configured as a conduit, while the signal conductor 1 is configured as a metal rod arranged in the conduit 2. The following four embodiments of the rod 1 are possible:

a) the rod is arranged in the conduit parallel to a conduit axis and is U-shaped, and the rod has ends secured to the electrical leads 15 arranged on the side surface of the conduit (this embodiment is shown in FIG. 2);
  b) the rod is arranged in the conduit parallel to the conduit axis and is L-shaped, and the ends of the rod are secured to the electrical leads 15, with one being arranged on the side surface of the conduit and another being arranged on an end plug of the conduit (this embodiment is shown in FIG. 3);
  c) the rod is arranged in the conduit parallel to the conduit axis and is shaped as a linear segment, and the ends of the rod are secured to the electrical leads 15 arranged on end plugs on the opposite sides of the conduit;
  d) the rod is arranged in the conduit perpendicularly to the conduit axis and along a conduit diameter and is shaped as a linear segment, and the ends of the rod are secured to the electrical leads 15 arranged on the opposite sides of the side wall of the conduit (this embodiment is shown in FIG. 4).

FIGS. 2-4 show embodiments of a moisture meter in which two metal bodies 16 configured as cups each having an opening at its bottom are mounted on the external surface of the conduit 2 coaxially relative to the electrical leads 15. The electrical leads 15 are mounted in the openings. FIG. 2 shows the embodiment in which an additional body 18 is secured to the bodies 16 by using metal tubes 17. The detector 6 is arranged in the body 18, while the segments 8, 9 of the cables are brought out to the detector 6 through the tubes 17. With such a design, the moisture meter may be used for controlling materials at extreme temperatures. Electronic components of the detector 6 are thermally insulated from the controlled material. The generator 5 and the measurement and control device 7 are arranged in an individual body 27 at a distance from the sensor and are connected to the sensor via cables.

Figure 5:
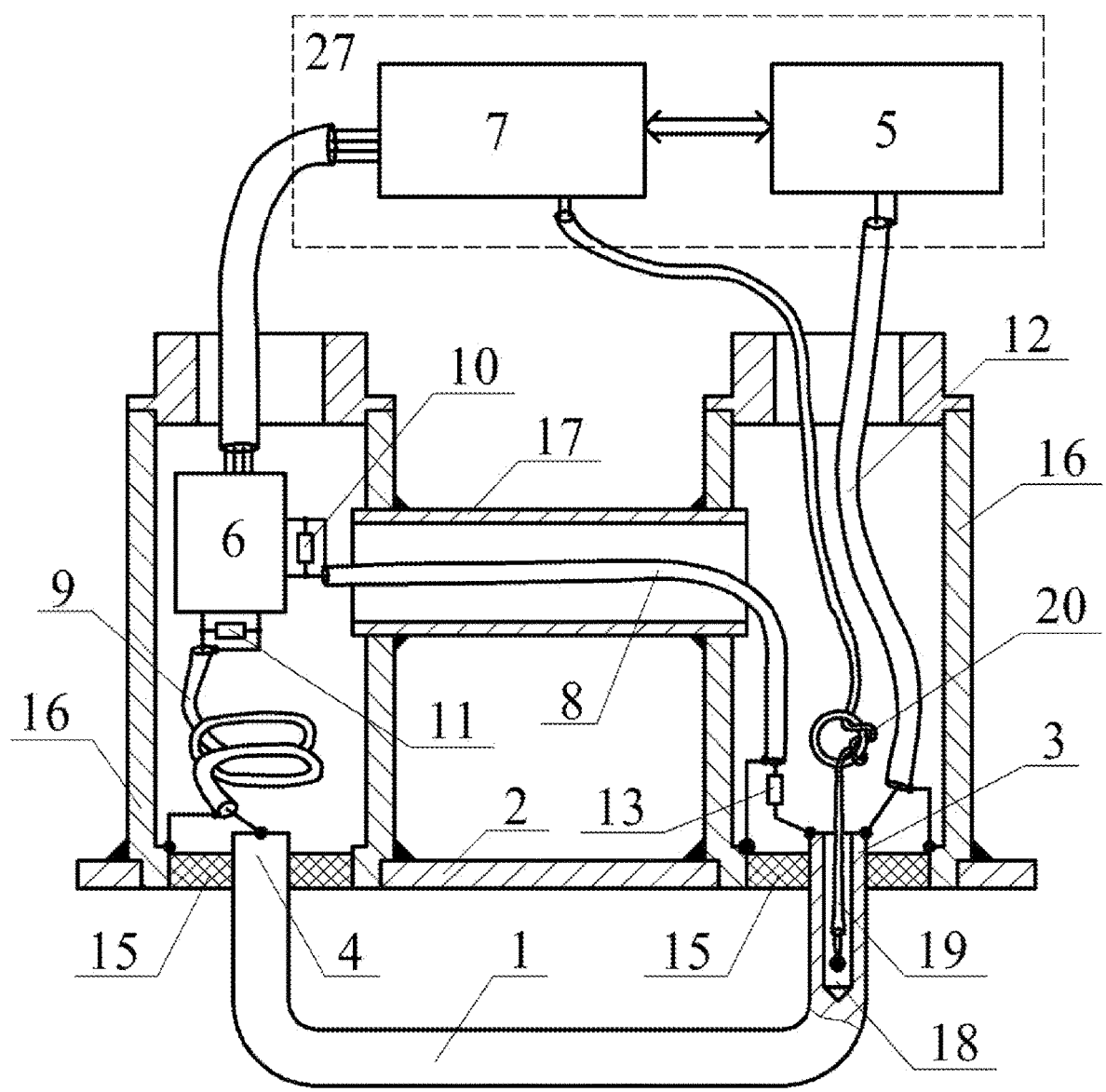

FIG. 5 shows an embodiment of a moisture meter used for controlling loose materials in hoppers, troughs, worms or on conveyor belts. In this embodiment, the shielding conductor 2 is configured as a shield, while the signal conductor 1 is configured as a U-shaped metal rod and secured on the shield 2 by means of the electrical leads 15 comprising a dielectric insulator. The input segment 12 and the additional segments 8, 9 are made of a coaxial cable and coupled to the signal conductor 1 of the sensor through the electrical leads 15. The two metal bodies 16 configured as cups each having an opening at its bottom are mounted on the external surface of the shield 2 coaxially relative to the electrical leads 15. The electrical leads 15 are mounted in these openings. The detector 6 is mounted in the first metal body 16 in which the output 4 of the signal conductor 1 is provided, and the cups are connected by the metal tube 17. The segment 8 of the coaxial cable is arranged in the tube 17, and the second segment 9 of the coaxial cable is arranged in the first metal body 16.

The rod 1 has an opening 18 made at its end along its axis. A temperature sensor 19 (for example, a thermocouple) coupled to the measurement and control device 7 is mounted in the opening 18. Insulated wires of the sensor 19 are wound, at the exit of the opening 18, around a ferrite ring 20 constituting a choke coil for high-frequency currents. Such a solution removes the impact of the temperature sensor 19 on the measurements of the probing signal.

Figure 6:
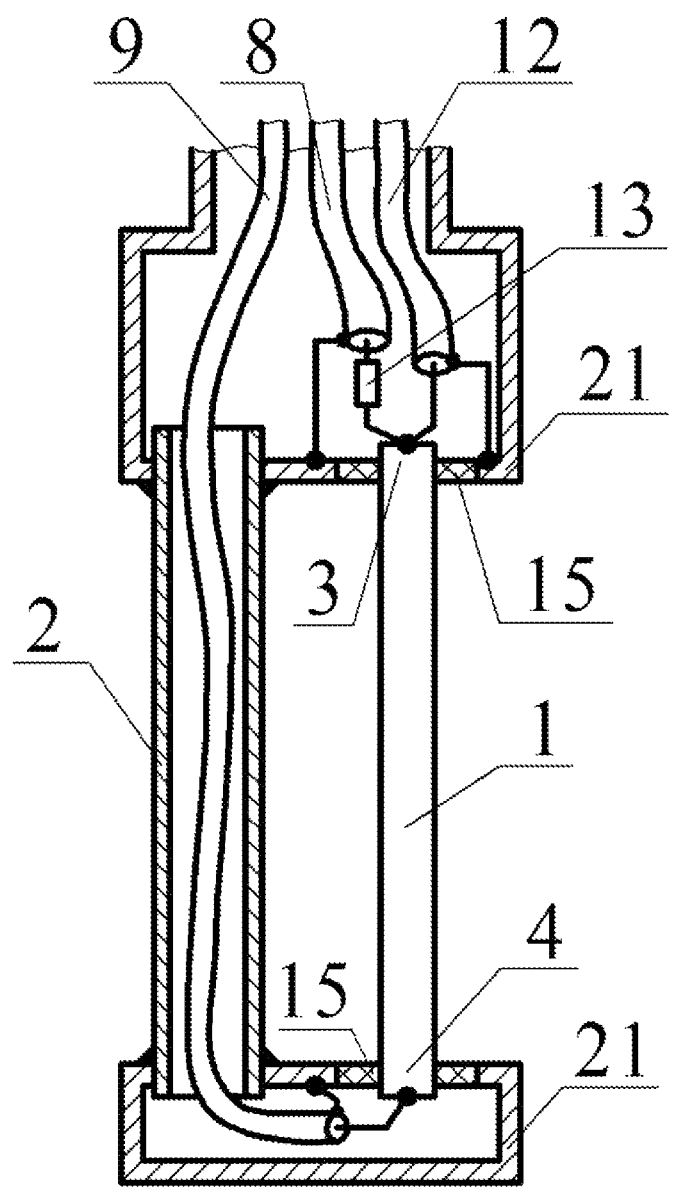

FIG. 6 shows an embodiment of the sensor of a submersible moisture meter which may be used for controlling loose materials in herds, barns, wagons, car bodies, as well as when storing and processing the loose materials directly in sampling locations. This embodiment may also be used for controlling fluid and paste-like materials in reservoirs. In this embodiment of the moisture meter, the signal 1 and shielding 2 conductors of the sensor are made as parallel rods. The shielding conductor 2 may comprise either one rod or several parallel rods. A through hole is made in one of the rods 2 along its length. Each rod has ends secured to first and second metal bases 21 and 22, with the rods constituting the shielding conductor 2 being secured such that they form an electrical contact with the bases 21 and 22. The signal conductor 1 has ends secured to the bases 21, 22 by means of the electrical leads 15 comprising a dielectric insulator. The segments 8, 9 and 12 of the transmission line are made of a coaxial cable and coupled to the signal conductor 1 of the sensor through the electrical leads 15. The input segment 12 and the first segment 8 of the cable are coupled to the input 3 of the sensor on the side of the first base 21, while the second segment 9 is coupled to the output 4 of the sensor on the side of the second metal base 22 and brought out to the side of the first base 21 via the through hole in the rod 2.

Figure 7:
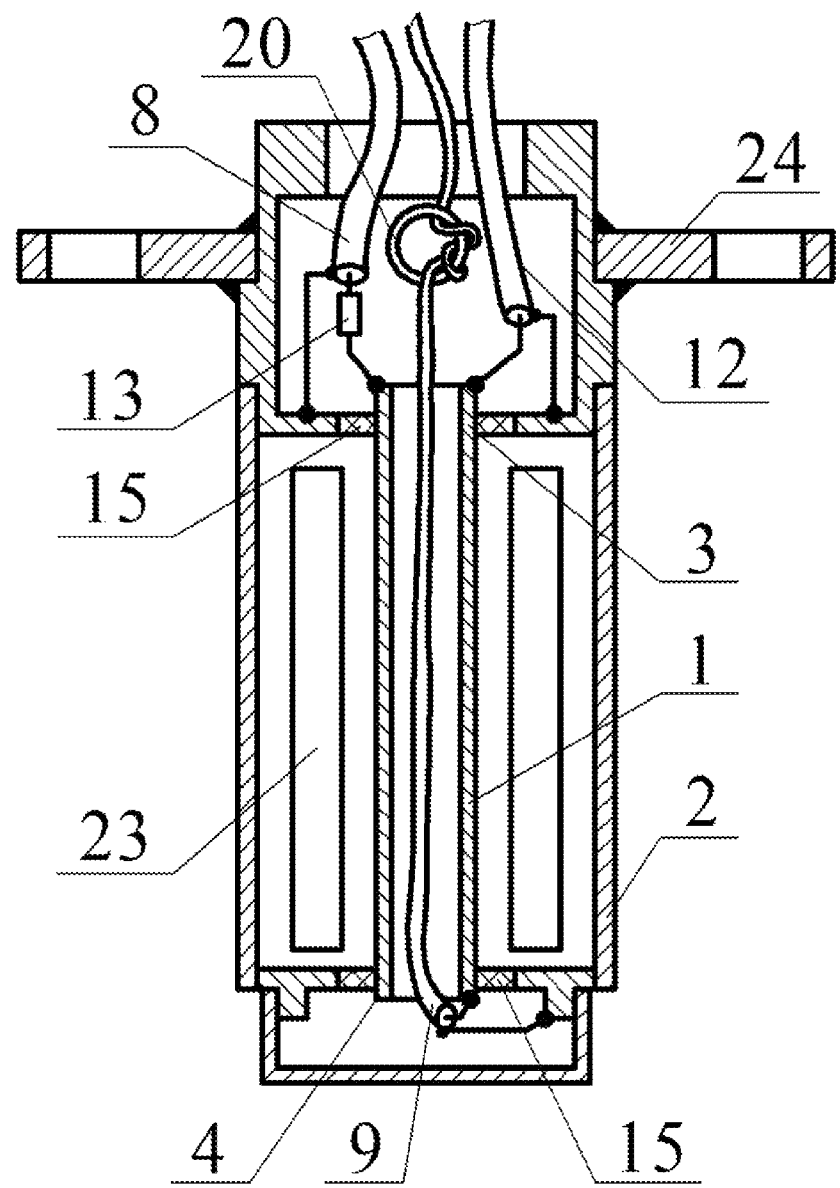
Figure 8:
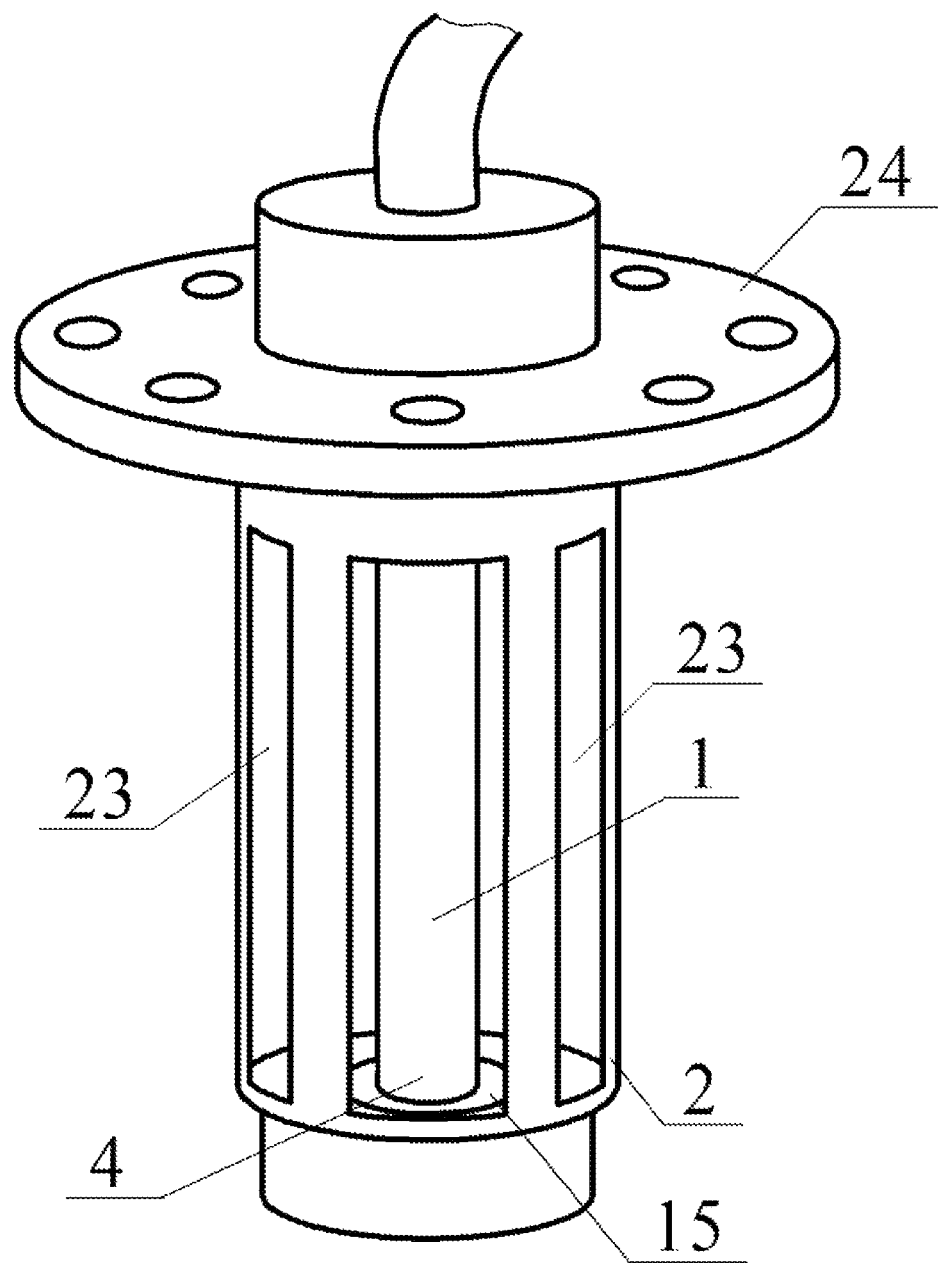

FIGS. 7 and 8 show an embodiment of the sensor of a submersible moisture meter which is used for controlling fluid materials in reservoirs and pipelines. In this embodiment, the shielding conductor 2 of the sensor is constituted by a metal conduit, with conduit walls having slots 23 through which the sensor is filled with the controlled material. The signal conductor 1 of the sensor is made as a metal tube arranged in the conduit 2 parallel to a conduit axis. The tube 1 has ends secured to the electrical leads 15 comprising a dielectric insulator. The electrical leads 15 are arranged on end walls of the conduit 2. The segments 8, 9 and 12 of the transmission line are coupled to the signal conductor of the sensor through the electrical leads, with said segments being made of a coaxial cable comprising an insulated enclosure. The segment 9 of the cable, which is coupled to the output 4 of the sensor, is arranged in the tube 1. The segment 9 of the coaxial cable is wound around the ferrite ring 20 at the exit of the tube 1 on the side of the input 3 of the sensor. Such a solution provides the suppression of parasitic electromagnetic coupling between the input 3 of the sensor and the shielding conductor of the coaxial cable 9. The sensor is provided with a flange 24 for its installation on a pipeline. The proposed sensor may also be used for controlling fluid materials in reservoirs; in this case, a thread fitting for securing the sensor to the conduit is made on the sensor instead of the flange 24, and cables exiting the sensor are passed through said conduit.

Figure 11:
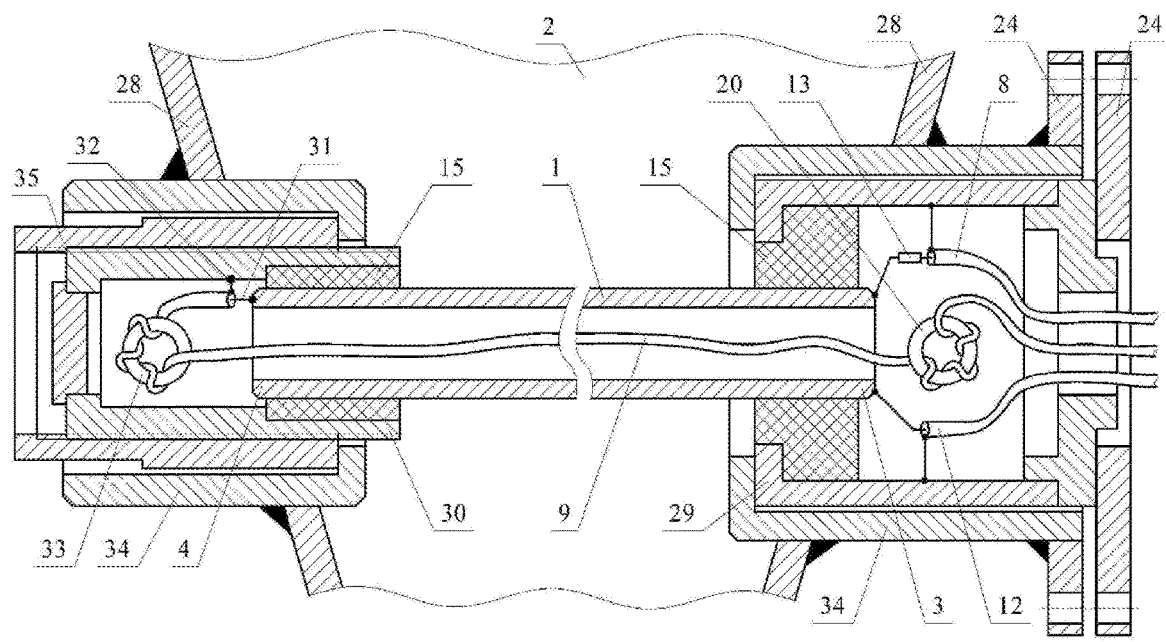
FIGS. 11 and 12 show an embodiment of a moisture meter which is used for controlling loose materials in hoppers, including highly conductive coarse-fraction materials, for example, anthracite, ore.
Figure 12:
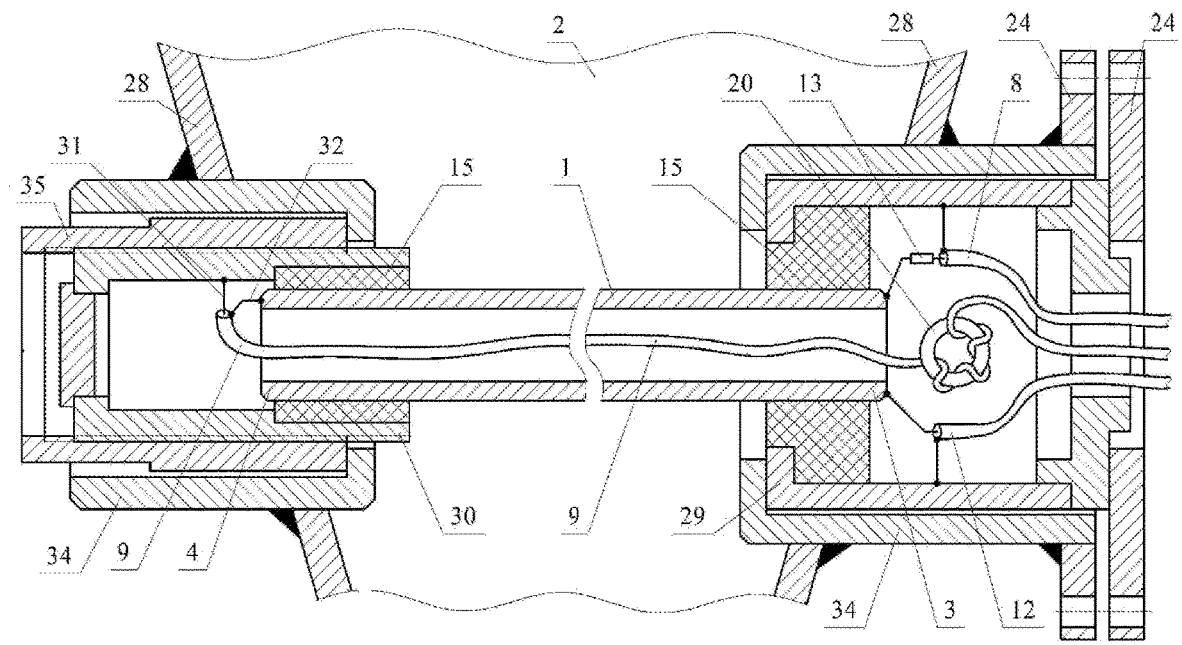

FIGS. 11 and 12 show an embodiment of the sensor of a moisture meter which is used for controlling loose materials in hoppers, including highly conductive coarse-fraction materials, for example, anthracite, ore. In this embodiment, metal walls 28 of a hopper serve as the shielding conductor 2 of the sensor. The signal conductor 1 of the sensor is made as a metal conduit. First 29 and second 30 metal bodies made as the cups each having an opening at its bottom are secured at the ends of the conduit. The first metal body 29 is arranged at the input 3 of the sensor, while the second metal body 30 is arranged at the output 4 of the sensor. The bodies 29, 30 are secured to the ends of the conduit 1 by means of dielectric insulators installed in the openings of the bodies 29, 30 and constituting the sealed electrical leads 15 in securing locations. The metal bodies 29, 30 are secured in the openings made in the walls 28 of the hopper, with said securing providing an electrical contact between said bodies and the metal walls 28 of the hopper. As a result of such a solution, the walls 28 of the hopper serves as the shielding conductor 2.

The first 8 and second 9 additional segments of the transmission line are made of a coaxial cable. The second additional segment 9 is arranged in the metal conduit 1. The segment 9 is wound around the ferrite ring 20 at the exit of the conduit 1 on the side of the input 3 of the sensor. Such a solution provides the suppression of parasitic electromagnetic coupling between the input 3 of the sensor and the shielding conductor of the second segment 9. In the absence of the ferrite ring 20, a parasitic capacity between the shielding conductor of the coaxial cable 9 and the metal structures bypasses the input 3 of the sensor and results in measurement errors.

The second additional segment 9 is coupled to the output 4 of the sensor. Said coupling may be performed in accordance with two embodiments shown in FIGS. 11 and 12.

According to a first embodiment (shown in FIG. 11), the coaxial cable 9 comprises a center conductor 31 electrically connected to the end of the conduit 1 and a shielding conductor 32 electrically connected to the second metal body 30. This connection is characterized by that a signal from the output 4 of the sensor is fed to the input of the segment 9 with no phase change therein. For such connection, a high parasitic capacity between the shielding conductor of the cable 9 and an inner surface of the conduit 1 appears to be coupled to the output 4 of the sensor, i.e. bypasses the sensor at the output 4. To suppress this effect resulting in measurement errors, the coaxial segment 9 of the cable is wound around a ferrite ring 30 at the exit of the conduit 1 on the side of the output 4 of the sensor. Being formed by this winding, a choke coil removes the above-indicated parasitic bypassing.

According to a second embodiment (shown in FIG. 12), the center conductor 31 of the coaxial cable 9 is electrically connected to the body 30, while the shielding conductor 32 of the cable 9 is electrically connected to the end of the conduit 1. For this connection, the high parasitic capacity between the shielding conductor of the cable 9 and the inner surface of the conduit 1 appears to be short-circuited by the connection of said conductors and does not impact on the measurement. Another peculiarity of the proposed connection is as follows: the signal from the output 4 of the sensor comes to the input of the segment 9 with a phase reversal. For the phase discriminator 6 with the characteristic shown in FIG. 10, such additional phase reversal results in that the frequency of a first registered resonance increases by 2 times.

The moisture meter designed as described above has the following set of advantages:

a measurement volume for the material is very big, may be equal to or more than 1 cu m, which removes the impact of a nonuniform moisture distribution within the volume on the measurements—the measurement accuracy is increased;

the material adhered to the conduit 1 does not impact on the measurements because not more than several liters of the material may be adhered to the conduit—such an amount is small enough compared to the controlled volume and does not result in measurement errors;

the size of the sensor may be equal to or more than 1 m, for which reason the wavelength of the electromagnetic probing signal in the controlled material is equal to or more than 2 m Therefore, the size of fractions of the controlled material may be equal to or more than 20 cm. Here it should be noted that in case of radio-wave probing, the measurement accuracy of materials is achieved provided the following requirement is fulfilled: the wavelength is not more than 8 . . . 10 times the size of the fractions of the material.

Figure 9:
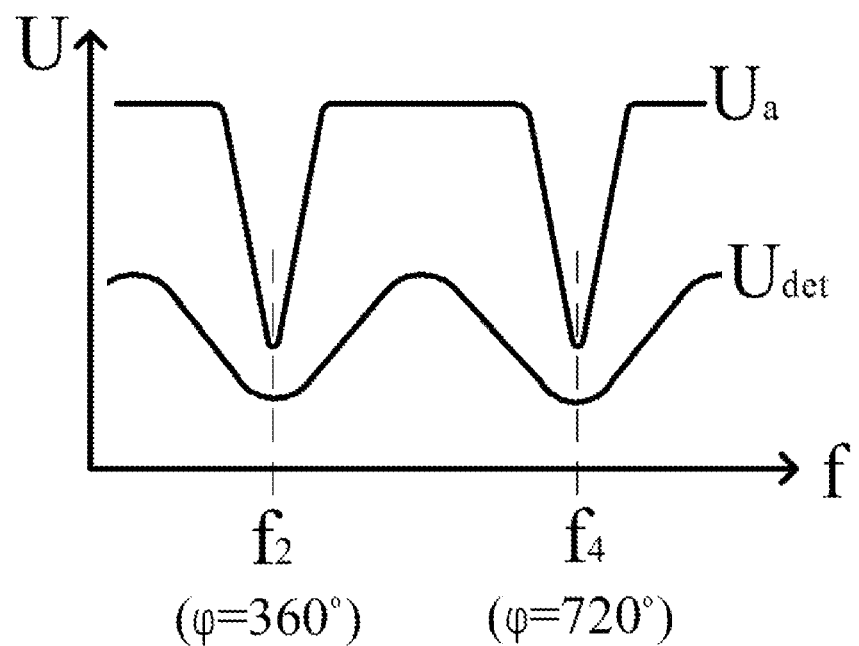
FIGS. 9 and 10 show spectra of an input signal of a detector and corresponding possible embodiments of detector circuits.
Figure 9:
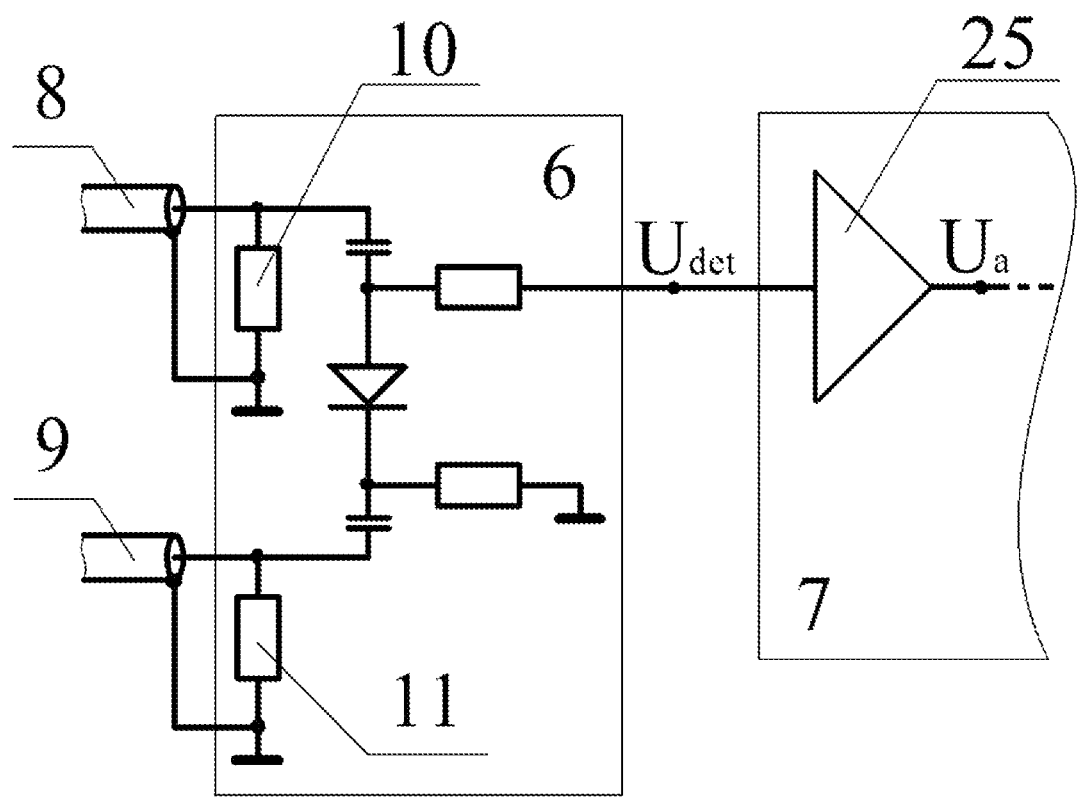
Figure 10:
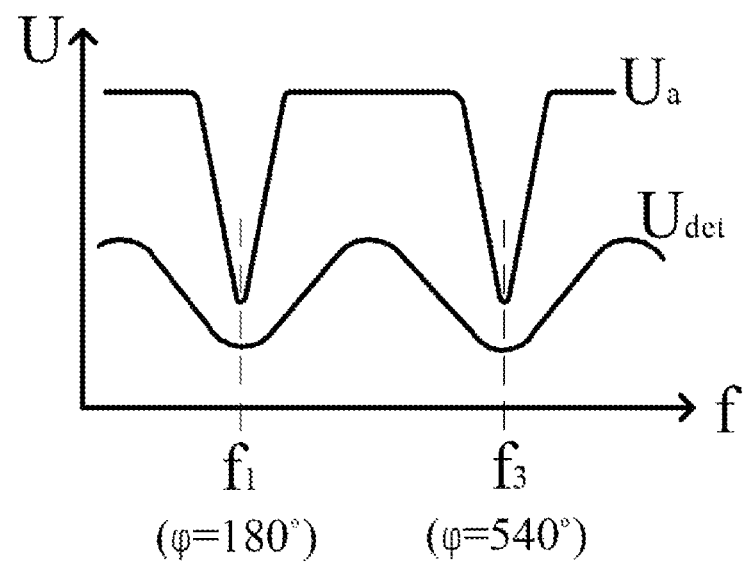
Figure 10:
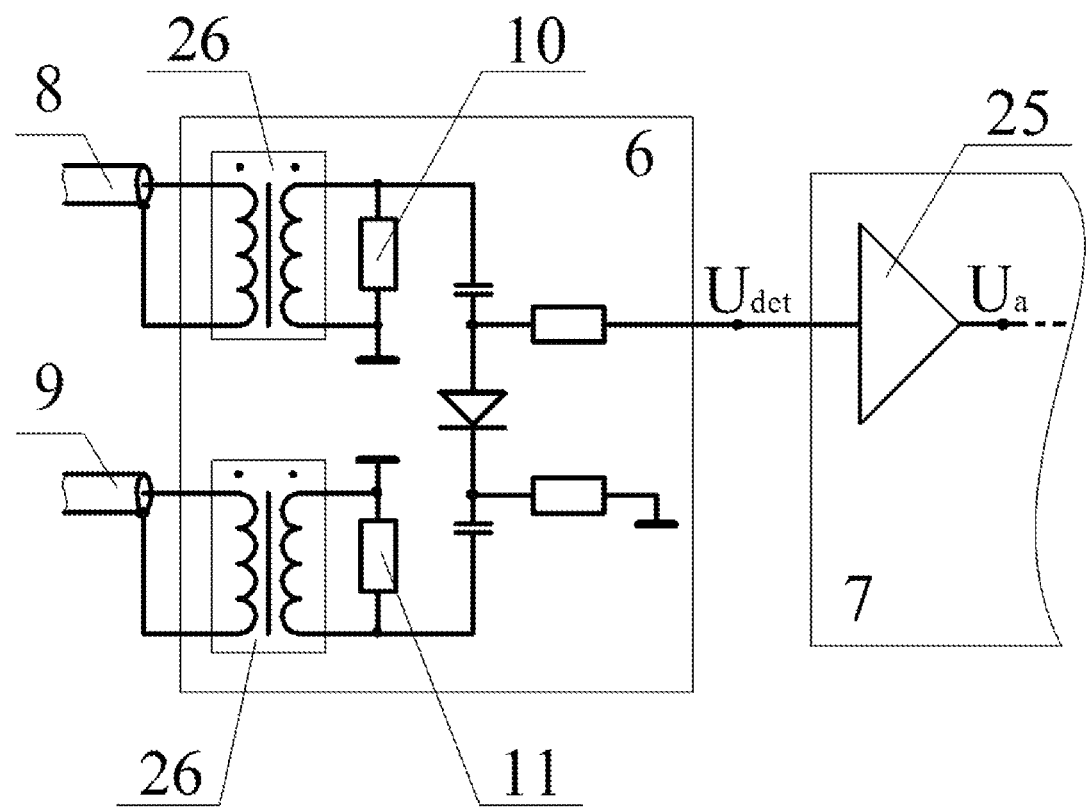

To provide simple mounting of the sensor in the hopper and the possibility of its fast demounting, the following solution is proposed: additional metal cups 34 each having an opening at its bottom are welded to the metal walls 28 of the hopper to secure the metal bodies 29, 30 to the metal walls 28 of the hopper. The metal bodies 28 and 29 are arranged and secured in said cups 34, with the first metal body 29 being pressed to the bottom of the additional cup 34 and secured in this position by using the flanges 24 on the side of the input 3 of the sensor, and the second metal body 30 being pressed to the bottom of the additional cup 34 and secured in this position by using a threaded sleeve 35 on the side of the output 4 of the sensor. FIGS. 9 and 10 show two possible embodiments of signal spectra by which the harmonic frequencies are determined, i.e. frequency dependence plots of a voltage $U_{det}$ at the output of the detector 6 and a voltage $U_a$ at the output of the amplifier 25 with a nonlinear characteristic. These figures also show equivalent circuits of the detector 6 configured as the phase discriminator. More specifically, FIG. 9 shows the spectrum and circuit of the detector in which a minimum output signal is achieved at in-phase input signals, and FIG. 10 shows the spectrum and circuit of the detector in which the minimum output signal is achieved at antiphase input signals. To generate such a characteristic, the inputs of the detector 6 are provided with transformers 26 which provide a 180° phase shift for one of the input signals of the detector relative to another of the input signals of the detector. For this purpose, a secondary winding of one transformer 26 is in-phase-coupled relative to its primary winding, and a secondary winding of another transformer 26 is antiphase-coupled relative to its primary winding.

The moisture meters fabricated in accordance with the present technical solution are made as an assembly of two modules: the sensor and an electronic unit 27. The electronic unit comprises the generator 5 and the measurement and control device 7. Such a solution has the advantage that the electronic units for all embodiments of the moisture meter are identical and interchangeable. The moisture meters differ from each other only in the sensors whose design depends on a material to be measured as well as measurement conditions (in a pipeline, reservoir, hopper, trough, or the like).

The apparatus for measuring the physical parameters of a material operates as follows. The generator 5 is swept through a range of operating frequencies by using the measurement and control device 7. The harmonic probing signal generated by the generator 5 is fed to the input 3 of the sensor either directly or through the segment 12 of the transmission line. The phase of the probing signal having passed to the output 4 of the sensor is compared to the phase of the signal at the input 3 of the sensor. Said phase comparison is performed in the detector 6. The voltage of the probing signal is fed from the input 3 and the output 4 of the sensor to the inputs of the detector 6 through the additional segments 8, 9 of the transmission line. While sweeping the generator 5, the voltage at the output of the detector 6 is measured and one or more frequencies at which the voltage at the output of the detector 6 attains a minimum are found. These frequencies are harmonic frequencies.

The harmonic frequencies are characterized by that the length of the signal conductor 1 of the sensor is equal to or a multiple of the half-wavelength of the probing signal in the material filling the sensor at these frequencies. Such a definition of the harmonic frequency is identical to the following definition: the phase shift of the probing signal along the length of the sensor is equal to or a multiple of 180° at the harmonic frequency. To accurately measure a phase progression for the probing signal which accrues to the sensor, the segments 8, 9 of the line have the same electrical lengths and the traveling-wave mode is provided therein.

It is necessary to note the main peculiarity of the present technical solution which differs the present technical solution from the prior art phase methods for moisture measurement. The prior art solutions virtually involve measuring the total phase shift of the probing signal having passed through the sensor with the controlled material and through the segments of the transmission line which are connected to the sensor. However, the total phase shift of the signal depends on the ratio of the wave impedances of the transmission line of the sensor and the segments of the transmission line which are coupled to the sensor. The wave impedance of the transmission line of the sensor is different for various controlled materials, as well as changes when the moisture of the controlled material changes. As a result, it is impossible to accurately determine the value of the phase progression that accrues directly to the transmission line segment of the sensor. Such measurement uncertainty does not allow one to accurately measure the dielectric parameters of the material.

In the present technical solution, said measurement uncertainty is eliminated by using the following property of two cascade-connected segments of long transmission lines: if a length of a first (input) segment is equal to or a multiple of a half-wavelength, a total phase shift of a signal at the output of a second segment does not impact on a wave impedance of the first segment.

This property of the long lines provides a basis for the present technical solution. This peculiarity of the present solution may be formulated as follows: dielectric parameter measurements are made when these measurements are not affected by the ratio of the wave impedances of the transmission line of the sensor and the segments of the transmission line which are coupled to the sensor.

By using the length of the signal conductor 1 of the sensor and the frequency of the probing signal at which a known integer number of half-waves falls within this length, it is possible to determine a phase velocity of the probing signal in the material of the sensor and, based thereon, determine the dielectric permittivity and other physical parameters. Similar to the first analogue and the prototype, the dielectric parameters are found in the present solution by measuring the harmonic frequencies when filling the sensor with the controlled material and when filling the sensor with air.

A refraction index n of the material, and more specifically, its real component is determined based on the ratio of said harmonic frequencies, as defined by $$n = \frac{f_i^0}{f_i^M}, \tag{2}$$

where $f_i^M$ is the frequency of the harmonic with the number i when filling the sensor with the controlled material, $f_i^0$ is the frequency of the harmonic with the number i when filling the sensor with air, i is the number of the harmonic.

The number i of the harmonic is equal to the number of half-waves falling within a length L of the signal conductor 1 of the sensor, namely:

$$L = \left(\frac{\lambda_M}{2}\right) \cdot i, \tag{2}$$

where $\lambda_M$ is the wavelength in the medium of the material filling the sensor, and the number of the harmonic i=1, 2, 3, . . . .

The measurements of the harmonic frequencies are made alternately when filling the sensor with air and when filling the sensor with the controlled material. As a result of the measurements, it is possible to obtain frequency values for a set of harmonics, depending on the width of the sweep range. In case of filling the sensor with air, it is enough to measure the harmonic frequency one time during apparatus fabrication, and to store these data to a processor memory of the measurement and control device 7. During the operation of the moisture meter, the repeated measurement at air filling may be required only for metrological calibration test.

To provide a high accuracy, it is preferable to work with the lowest harmonics. In most practical cases, it is enough to make measurements only at the first or second harmonic (i=1 or 2). To make measurements at the second harmonic, the detector 6 is necessary, in which the minimum output voltage $U_{det}$ is achieved at in-phase input signals, i.e. when its input signals have a phase shift φ=360°, 720°, . . . . This embodiment is shown in FIG. 9. FIG. 10 shows a spectrum and embodiment of the detector in case of measurements at the first harmonic. In the detector 6 shown in FIG. 10, the minimum output signal is achieved when its input signals are antiphase, i.e. the phase shift therebetween is equal to φ=180°, 540°, . . . . The phase discriminator, whose circuit is shown in FIGS. 9 and 10, comprises a semiconductor diode coupled to probing signal circuits through decoupling capacitors. The output voltage of the phase discriminator is picked up directly from the semiconductor diode and provided to the output of the detector 6 through resistors having a resistance that is an order of magnitude higher than the resistance of the resistors 10, 11. It should be noted that the circuits of the phase discriminator shown in FIGS. 9, 10 are simplified, but the detector configured literally based thereon is operative.

Unlike the requirements applied for the phase detector of the prior art technical solutions (second analogue), other requirements are applied for the phase discriminator of the present technical solution, and in particular, the linearity of the conversion of the phase difference between the input signals in the phase discriminator is of no importance. Correspondingly, the principle of input-signal phase coincidence (or phase opposition) control is other than at continuous phase measurements. The determination accuracy of input-signal phase coincidence (or phase opposition) is much higher than the measurement accuracy of a random phase value in the range of 0° to 360°. Therefore, the measurement accuracy of physical parameters in the proposed solution is significantly higher and provided, among others, for materials substantially attenuating the probing signal.

At the same time, the proposed solution solves the problem of phase measurement uncertainty peculiar to the second analogue, which is formulated as follows: being measured at a fixed frequency, the phase of the signal having passed through high-permittivity materials may exceed manifold 360°. In the present technical solution, this problem is solved by properly selecting a lower frequency of the sweep range of the generator—said frequency should be lower than the frequency of the first (or second) harmonic. If this requirement fails to be fulfilled due to the high dielectric permittivity of the material, the solution according to the first analogue and the prototype is used, i.e. the refraction index n is determined based on the frequency difference between neighboring harmonics.

The refraction index n given in the equation (2) is also referred to as a slowness factor or wavelength shorting coefficient in technical literature. This parameter is associated with a dielectric permittivity $\varepsilon_r$ of the material at low dielectric loss as follows:

$$\varepsilon_r = n^2. \tag{4}$$

The moisture or other physical parameters of the material impacting on the dielectric permittivity, for example, a substance-mixture concentration, density, is determined based on the measured value n (or $\varepsilon_r$). Calibration tables recorded in the processor of the device 7 and associating a measured parameter with the values n (or $\varepsilon_r$) are used for calculations. In parallel, the temperature of the controlled material is measured to determine the moisture. In the moisture meters fabricated in accordance with the present technical solution, the calibration tables are recorded for four temperature values from a possible operating range. The moisture meter builds the calibration table for a certain temperature automatically by using an interpolation between the tables with the closest temperature values recorded in the processor memory of the device 7.

The dielectric parameters become complex at the high conductivity of the controlled material. A complex dielectric permittivity $\dot{\varepsilon}_r$ is determined via a complex refraction index $\dot{n}$ according to the following relations:

$$\dot{\varepsilon}_r = \varepsilon'_r - j\varepsilon''_r = (n-jk)^2 = (n^2-k^2) - j(2nk). \quad (5)$$

The real component n of the complex refraction index $\dot{n} = n - jk$ is determined according to the equation (2), and the imaginary component k is determined based on the attenuation of the probing signal in the controlled material. To measure k, the detector 6 comprises a device for measuring and calculating a ratio of voltages $U_3$, $U_4$ of the probing signal at the input 3 and the output 4 of the sensor, respectively. By using the ratio $U_3/U_4$ representative of the attenuation of the probing signal in the material, the imaginary component k is determined as follows:

$$k = \frac{\lambda_0}{2\pi L} \cdot \ln\left(\frac{U_3}{U_4}\right), \quad (6)$$

where $\lambda_0$ is the wavelength in air, L is the length of the signal conductor 1 of the sensor.

When calculating the ratio $U_3/U_4$, the output voltage ratio given in the equation (1) is taken into account.

Thus, the present technical solution allows one to determine the complex values of the dielectric parameters, thereby increasing the measurement accuracy of highly conductive materials.

Minima in the spectrum of the output signal of the detector 6 may be searched and used for calculating the harmonic frequencies in accordance with one of the following algorithms.

Algorithm 1

The generator 5 is swept through the range of frequencies in discrete steps and the voltage measured by the detector 6 is recorded in each step of said sweeping. The harmonic frequencies are determined based on a set of measured voltage values obtained for the whole range of sweep frequencies. The processor of the device 7 calculates the refraction index n of the material based on the determined values of the harmonic frequencies. Further, the processor calculates the physical parameters of the controlled material based on calibration characteristics of the controlled material and taking into account its temperature. To provide the operation according this algorithm, the generator 5 is configured as a synthesizer that produces the frequency of the probing signal according to a digital code set by the measurement and control device 7.

Algorithm 2

The generator 5 is swept through the range of frequencies continuously until the minimum voltage $U_{det}$ is found. Further, the generator 5 is switched to an autotracking mode, i.e. automatic control to the frequency of the minimum. When finding the minimum, the frequency of the generator 5 is read and the refraction index by which the physical parameters of the controlled material are determined is further calculated as in the previous algorithm. To implement this algorithm, the device 7 comprises an analog component configured to sweep the frequency of the generator 5 until the minimum is achieved at the output of the detector 6, and a component for measuring the frequency of the generator 5.

To increase the accuracy of measuring the harmonic frequencies, the device 7 is supplemented with the amplifier 25 having a nonlinear gain characteristic. The amplifier provides the amplification of the output voltage of the detector 6 such that a low-level voltage is amplified, while a high-level voltage is limited. In the spectra shown in FIGS. 9 and 10, the minima of the voltage $U_a$ become sharp, which allows increasing the accuracy of measuring the frequency at the minimum.

Similar to the prototype, the detector 6 in the present technical solution is coupled to the sensor through the segments of the transmission line. This allows semiconductor radioelements to be arranged at a distance from the constructive elements of the sensor which are in direct contact with the controlled material. To measure materials at extreme temperatures, the conductors of the input 12 and additional 8, 9 segments of the transmission line and the conductors 1, 2 of the sensor are made of metal resistant to high temperature exposure, and the electrical connection of said conductors is made using a high-temperature solder.

One of the advantages of the present technical solution is that unlike the prior art solutions, it provides the measurement of conductive materials without having to mount dielectric tubes over the signal conductor. This allows the moisture meters to be used for abrasive materials as well as for loose coarse-fraction materials. The signal conductor is made of corrosion-resistant tempered steel, for example, of type 40X13 (AISI 420), for said applications.

Tests carried out on the fabricated instances of the apparatus for measuring the physical parameters (moisture meter) have confirmed the efficiency of the present technical solution. As an example, let us give the test results of the fabricated moisture meter instance for aqueous solutions of salt NaCl which are either saturated or unsaturated and comprise an undissolved solid phase. The main parameters of the moisture meter are as follows:

the length of the signal conductor of the sensor is equal to 100 mm;
the detector is configured in accordance with the embodiment in which the minimum output signal corresponds to the antiphase input signals (FIG. 10);
the sweep range of the generator is 2 to 390 MHz;
the allowable attenuation level of the probing signal in the sensor is less than 60 dB;
the measurement range of the refraction index is n=4 . . . 120.

The moisture meter provides measurements of dielectric parameters and a water content in the whole range from pure water to a suspension in which a solid-to-liquid phase ratio is 100%.

What is claimed is:

1. A method for measuring the physical parameters of a controlled material by using:
   (a) a sensor configured as a segment of a long transmission line having a signal conductor and one or more shielding conductors,
   (b) a generator,
   (c) a detector,
   (d) a first additional segment of the transmission line,
   wherein the method comprises:
   (1) filling the sensor with the controlled material,
   (2) generating, by the generator, a harmonic high-frequency probing signal, (3) feeding the probing signal to an input of the sensor,
(4) sweeping the generator through a range of frequencies,
(5) during said sweeping, measuring a voltage at an output of the detector,
(6) feeding the probing signal from the input of the sensor to an input of the detector through the first additional segment of the transmission line where a traveling-wave mode is provided,
(7) converting, by the detector, the probing signal to a low-frequency voltage,
(8) determining, based on minimum values of the low-frequency voltage, harmonic frequencies at which a length of the signal conductor is equal to a half-wavelength of the probing signal in the controlled material or a multiple of the half-wavelength of the probing signal in the controlled material,
(9) comparing the harmonic frequency measured when filling the sensor with the controlled material to the harmonic frequency measured when filling the sensor with air, and determining the physical parameters of the controlled material based on these frequencies or the ratio thereof,
wherein the method is characterized by:
using a second additional segment of the transmission line, the second addition segment having an electrical length set equal to an electrical length of the first additional segment,
configuring the detector as a phase discriminator in which an output voltage attains a minimum when its input signals are either in-phase or antiphase,
feeding the probing signal from the output of the sensor to a second input of the detector through the second additional segment of the transmission line where the traveling-wave mode is provided, and
determining the harmonic frequencies by comparing, by the detector, a phase of the high-frequency probing signal at the input of the sensor to the phase of the high-frequency probing signal at the output of the sensor.

2. The method of claim 1, wherein said physical parameters comprise a moisture, dielectric permittivity, substance-mixture concentration, density, refraction index of the material.

3. The method of claim 2, wherein the generator is swept through the range of frequencies in discrete steps, the voltage at the output of the detector is determined in each step of said sweeping, and the harmonic frequencies are determined based on a frequency dependency of the voltage measured in the whole range of sweep frequencies of the generator.

4. The method of claim 2, comprising comparing levels of the probing signal at the input and output of the sensor, determining dielectric loss in the controlled material based on the ratio of the levels, and refining the measured physical parameters based on the determined dielectric loss.

5. An apparatus for measuring the physical parameters of a controlled material, comprising:
a measurement and control device,
a sensor configured as a segment of a long transmission line having a signal conductor and one or more shielding conductors between which a space is to be filled with a controlled material;
a generator coupled to an input of the sensor and configured to generate a high-frequency harmonic probing signal, the generator being further configured to be swept through a range of frequencies and having a control input for frequency adjustment, the control input being coupled to the measurement and control device;
a detector having an output coupled to the measurement and control device, the detector being configured to convert the high-frequency probing signal to a low-frequency voltage; a first additional segment of the two-conductor transmission line, the first additional segment having an input coupled to the input of the sensor and an output coupled to a first input of the detector, wherein
the first additional segment of the transmission line is matched at the output coupled to the detector, which is provided, for example, by coupling a matching resistor in parallel to the output of said segment,
an output of the generator is coupled to the input of the sensor either directly or through an input segment of the transmission line,
wherein the apparatus is characterized in that the detector is configured as a phase discriminator in which an output voltage attains a minimum when its high-frequency input signals are either in-phase or antiphase,
wherein the apparatus further comprises a second additional segment of the two-conductor transmission line, the second additional segment having an input coupled to the output of the sensor and an output coupled to a second input of the detector, the second additional segment having an electrical length equal to an electrical length of the first additional segment, and the second additional segment of the transmission line being also matched at the output coupled to the detector,
the apparatus being configured to determine the harmonic frequencies by comparing, a phase of the high-frequency probing signal at the input of the sensor to the phase of the high-frequency probing signal at the output of the sensor.

6. The apparatus of claim 5, wherein the generator is configured as a synthesizer producing the frequency of the probing signal in accordance with a digital code set by the measurement and control device, and wherein the measurement and control device comprises a processor configured to calculate the physical parameters of the controlled material based on values of the harmonic frequencies of the probing signal.

7. The apparatus of claim 6, wherein the detector comprises a device for measuring and calculating a ratio of levels of the probing signal at the input and output of the sensor, the device having an output coupled to the measurement and control device, and wherein the processor of the measurement and control device calculates the physical parameters of the material based on the values of the harmonic frequencies and the ratio of the levels of the probing signal at the input and output of the sensor.

8. The apparatus of claim 5, wherein the first additional segment of the transmission line is coupled to the input of the sensor through a power divider, the power divider being configured, in particular, as a resistor coupled between the input of the sensor and the input of the first additional segment of the transmission line.

9. The apparatus of claim 5, wherein the shielding conductor of the sensor is made as a conduit, while the signal conductor of the sensor is made as a metal rod arranged in the conduit either parallel to a conduit axis or perpendicularly to the conduit axis along a conduit diameter, and wherein the signal conductor has ends secured to electrical leads comprising a dielectric insulator, the electrical leads being arranged either on a side surface of the conduit or on an end plug of the conduit, the signal conductor of the sensor being either U-shaped, or L-shaped, or shaped as a linear segment, and the input and additional segments of the transmission line being made of a coaxial cable and coupled to the signal conductor of the sensor through the electrical leads.

10. The apparatus of claim 9, wherein two metal bodies made as cups each having an opening at its bottom are mounted on an external surface of the conduit coaxially relative to the electrical leads, the electrical leads being mounted in the openings, the cups being connected through metal tubes to an additional body having the detector installed therein, and the additional segments of the transmission line being arranged in the metal tubes.

11. The apparatus of claim 5, wherein the shielding conductor of the sensor is made as a shield, while the signal conductor of the sensor is made as a metal rod that is mounted on the shield and is U-shaped, the signal conductor having ends secured to electrical leads comprising a dielectric insulator, the electrical leads being secured in the shield, and the input and additional segments of the transmission line being made of a coaxial cable and coupled to the signal conductor of the sensor through the electrical leads.

12. The apparatus of claim 11, wherein two metal bodies made as cups each having an opening at its bottom are mounted on an external surface of the shield coaxially relative to the electrical leads, the electrical leads being mounted in the openings, and wherein the detector is mounted in the first metal body in which the output of the signal conductor of the sensor is provided, the cups being connected by a metal tube having the first additional segment of the transmission line arranged therein, and the second additional segment of the transmission line being arranged in the first metal body.

13. The apparatus of claim 5, wherein the conductors of the input and additional segments of the transmission line and the conductors of the sensor are made of metal resistant to high-temperature exposure, and the electrical connection of said conductors is made by a high-temperature solder.

14. The apparatus of claim 5, wherein the signal conductor made as the metal rod has an end opening along a rod axis, and wherein a temperature sensor, in particular, a thermocouple, is mounted in the end opening, the temperature sensor having wires being coupled to the measurement and control device, the wires being wound around a ferrite ring at the exit of the end opening of the rod.

15. The apparatus of claim 5, wherein the shielding and signal conductors of the sensor are made as parallel rods, and wherein the shielding conductor may comprise either one rod or several parallel rods among which one rod has a through hole made along a rod length, each of the rods having ends secured to first and second metal bases, the rods constituting the shielding conductor being secured to the bases such that they form an electrical contact with the bases, the signal conductor having ends secured to the bases by using electrical leads comprising a dielectric insulator, the input and additional segments of the transmission line being made of a coaxial cable and coupled to the signal conductor of the sensor through the electrical leads, the input and the first additional segments of the transmission line being coupled to the input of the sensor on the side of the first base, and the second additional segment of the transmission line being coupled to the output of the sensor on the side of the second metal base and being brought out to the side of the first base via the through hole in the rod.

16. The apparatus of claim 5, wherein the shielding conductor of the sensor is made as a conduit having slots on conduit walls, while the signal conductor of the sensor is made as a metal tube arranged in the conduit parallel to a conduit axis, the signal conductors having ends secured to electrical leads comprising a dielectric insulator, the electrical leads being arranged on end conduit walls, the input and additional segments of the transmission line being coupled to the signal conductor of the sensor through the electrical leads, the input and additional segments of the transmission line being made of a coaxial cable, the second additional segment of the transmission line coupled to the output of the sensor being arranged in the tube constituting the signal conductor, and said segment of the coaxial cable being wound around a ferrite ring at the exit of the tube on the side of the input of the sensor.

17. The apparatus of claim 5, wherein the sensor is used for measuring materials present in a metal hopper, the hopper having metal walls (28) serving as the shielding conductor (2) of the sensor installed in the hopper, the signal conductor (1) of the sensor is made as a metal conduit, a first (29) and second (30) metal bodies made as cups each having an opening at its bottom are secured at the ends of the conduit, the first metal body (29) being arranged at the input (3) of the sensor and the second metal body (30) being arranged at the output (4) of the sensor, said bodies (29, 30) are secured to the ends of the conduit (1) by means of dielectric insulators installed in the openings of said metal bodies (29, 30) and constituting sealed electrical leads (15) in the securing location, the first (29) and second (30) metal bodies are secured in the openings made in the walls (28) of the hopper, said securing providing an electrical contact between the metal bodies (28, 29) and the metal walls (28) of the hopper, the first (8) and second (9) additional segments of the transmission line are made of a coaxial cable, the second additional segment (9) being arranged in the metal conduit (1), the segment (9) being wound around a ferrite ring (20) at the exit of the conduit (1) on the side of the input of the sensor (3).

18. The apparatus of claim 17, wherein the second additional segment of the transmission line (9) which is made of the coaxial cable is coupled to the output of the sensor (4) such that a center conductor (31) of the coaxial cable is electrically connected to the end of the conduit (1) and a shielding conductor (32) of the coaxial cable is electrically connected to the second metal body (30), the segment (9) being wound around a ferrite ring (33) at the exit of the conduit (1) on the side of the output of the sensor (4).

19. The apparatus of claim 17, wherein the second additional segment (9) of the transmission line which is made of the coaxial cable is coupled to the output of the sensor (4) such that a shielding conductor (32) of the coaxial cable is electrically connected to the end of the conduit (1) and a center conductor (31) of the coaxial cable is electrically connected to the second metal body (30).

20. The apparatus of claim 17, wherein additional metal cups (34) each having an opening at its bottom are used to secure the metal bodies (29, 30) to the metal walls (28) of the hopper, the additional metal cups (34) being welded to the metal walls (28) of the hopper, the metal bodies (28, 29) being arranged and secured in said cups, the first metal body (29) being pressed to the bottom of the additional cup (34) and secured in this position by using the flanges (24) on the side of the input (3) of the sensor, and the second metal body (30) being pressed to the bottom of the additional cup (34) and secured in this position by using a threaded sleeve (35) on the side of the output (4) of the sensor.

\* \* \* \* \*